[19] United States Patent
Conolly

[11] Patent Number: 4,868,501
[45] Date of Patent: Sep. 19, 1989

[54] METHOD AND MEANS FOR MAGNETIC RESONANCE SPIN-ECHO IMAGING USING AN ADIABATIC THREE PI PULSE SEQUENCE

[75] Inventor: Steven M. Conolly, Stanford, Calif.

[73] Assignee: Leland Stanford University, Stanford, Calif.

[21] Appl. No.: 205,431

[22] Filed: Jun. 10, 1988

[51] Int. Cl.⁴ ............................................. G01R 33/20
[52] U.S. Cl. .................................... 324/309; 324/307
[58] Field of Search ............... 324/300, 307, 309, 310, 324/311, 312, 313, 314, 318, 322; 128/653

[56] References Cited

U.S. PATENT DOCUMENTS

| | | | |
|---|---|---|---|
| 4,442,404 | 4/1984 | Bergmann | 324/309 |
| 4,486,709 | 12/1984 | Bendall | 324/309 |
| 4,528,509 | 7/1985 | Radda et al. | 324/318 |
| 4,581,581 | 4/1986 | Pelc | 324/307 |
| 4,661,775 | 4/1987 | Kormos et al. | 324/307 |
| 4,727,324 | 2/1988 | Bendall et al. | 324/307 |

*Primary Examiner*—Michael J. Tokar
*Attorney, Agent, or Firm*—Flehr, Hohbach, Test, Albritton & Herbert

[57] ABSTRACT

An adiabatic pulse suitable for generating selective spin echoes for both MR imaging and spectroscopy is described. The pulse requires no gradient reversal to achieve phase compensation. Like adiabatic inversion pulses the new pulse performs a $\pi$ rotation for any amplitude exceeding a threshold. Unlike inversion pulses, this pulse leaves no phase variation across the slice. The pulse is actually a composite consisting of a $2\pi$ and a $\pi$ pulse. The $2\pi$ pulse merely compensates for the phase of the $\pi$ phase; it performs no net rotation. This compensation is immune to RF inhomogeneity and nonlinearity.

14 Claims, 7 Drawing Sheets

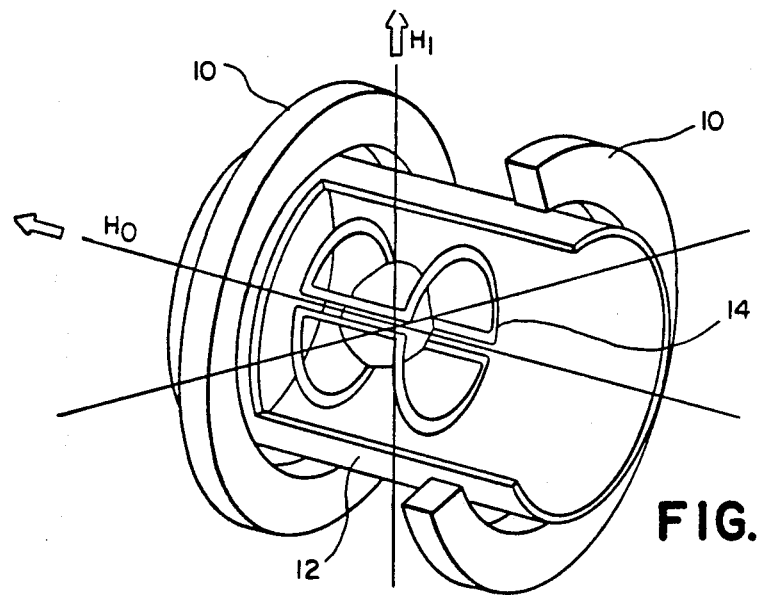
FIG.—1A
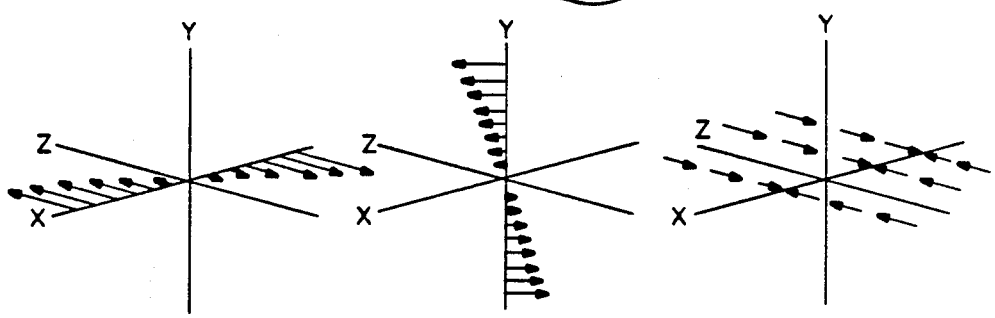
FIG.—1B   FIG.—1C   FIG.—1D
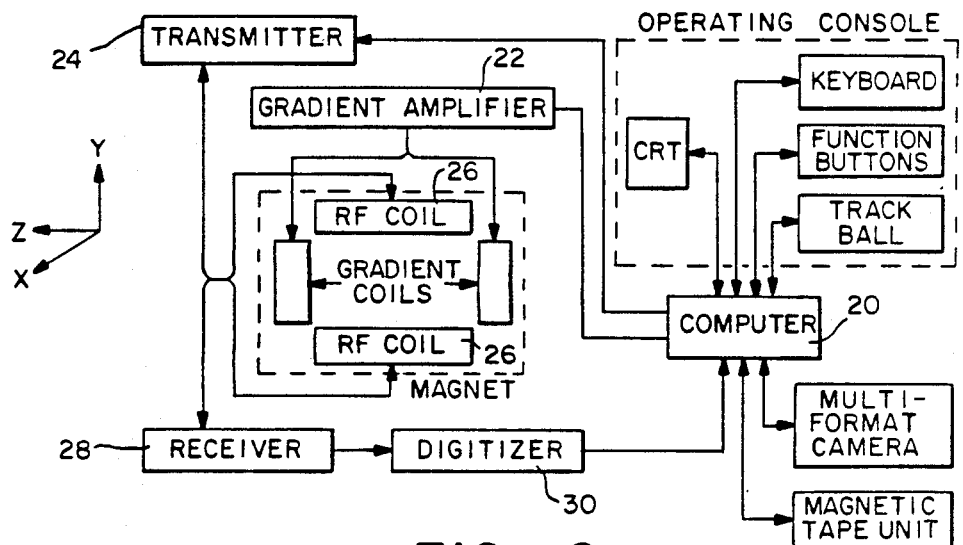
FIG.—2

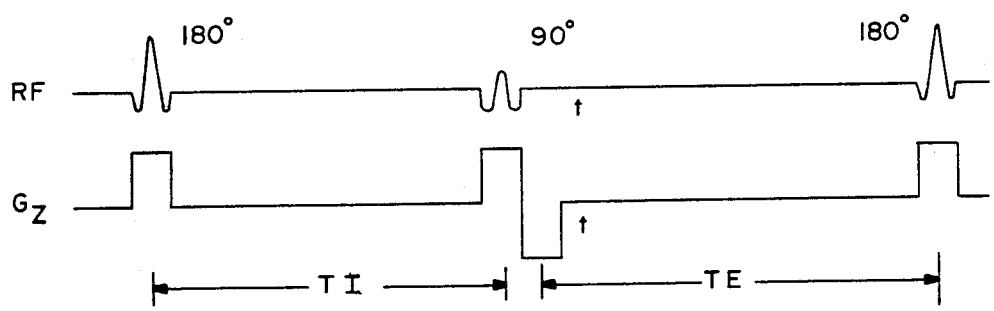
FIG.—3
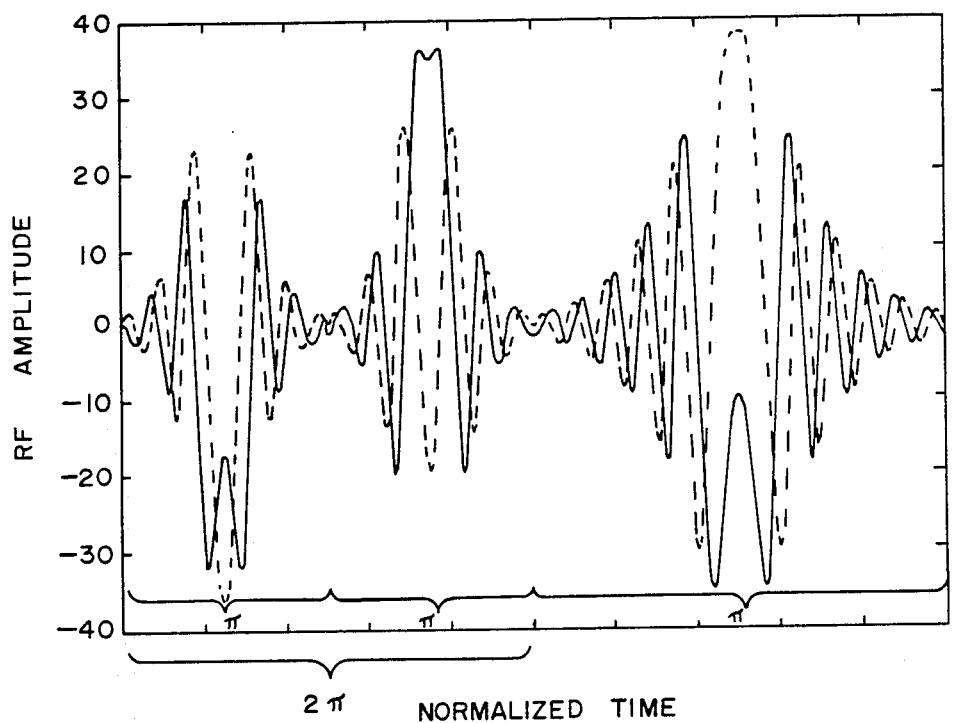
FIG.—4
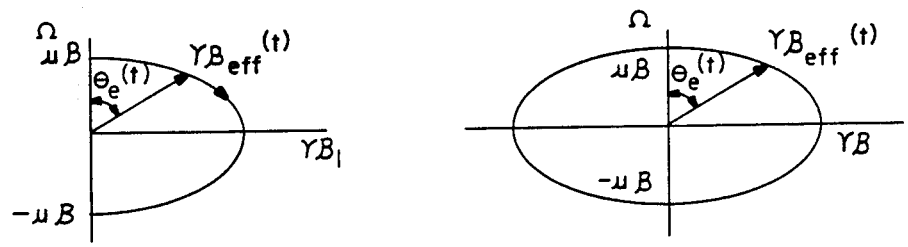
FIG.—6   FIG.—7

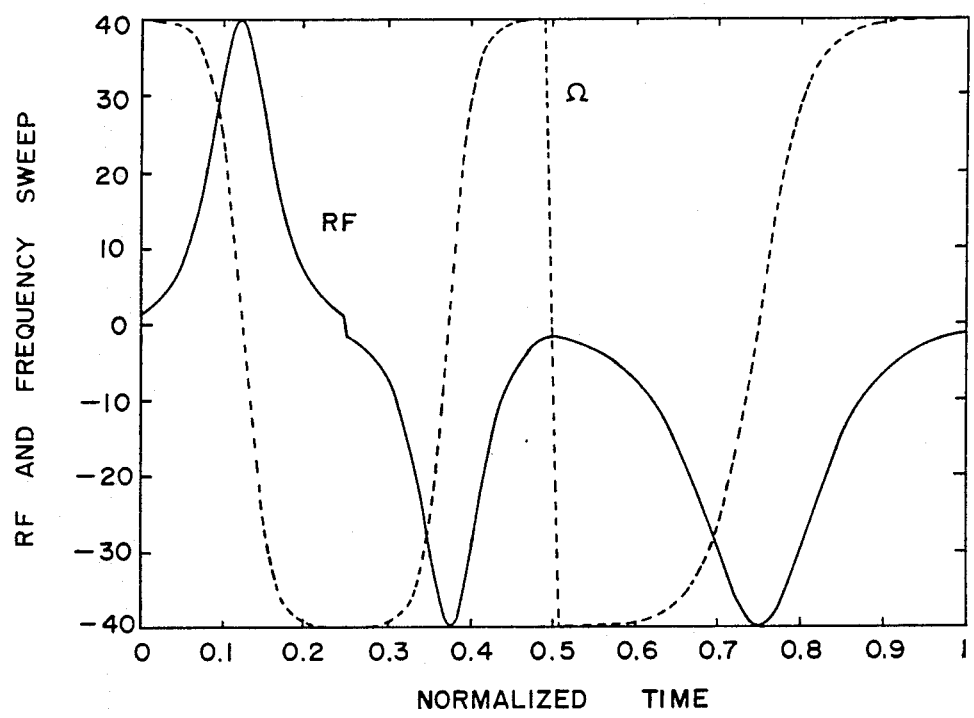
FIG.—8
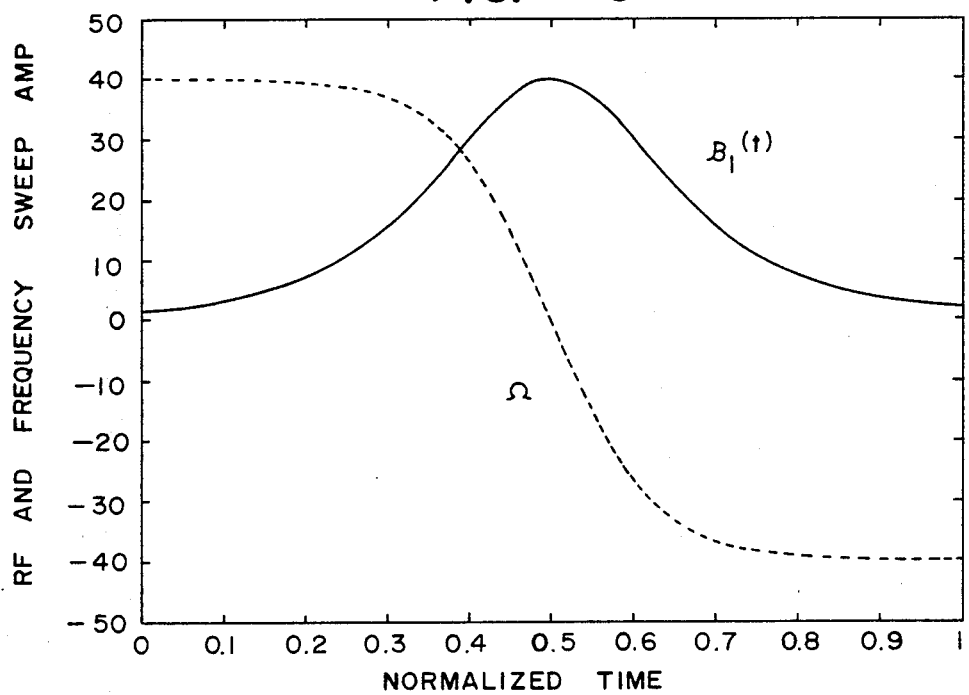
FIG.—5

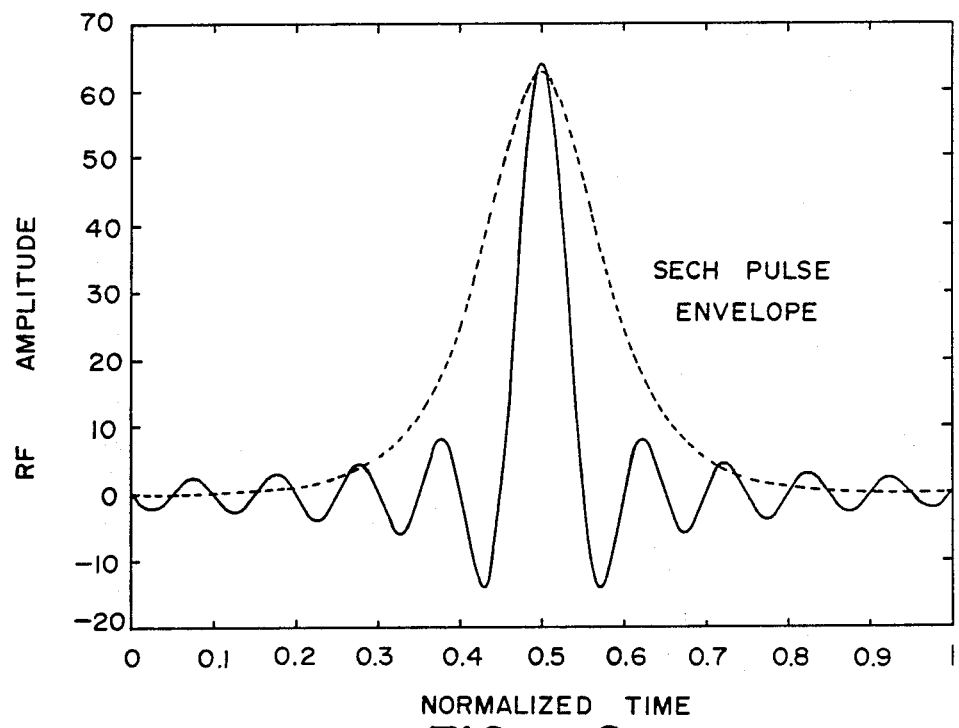
FIG.—9
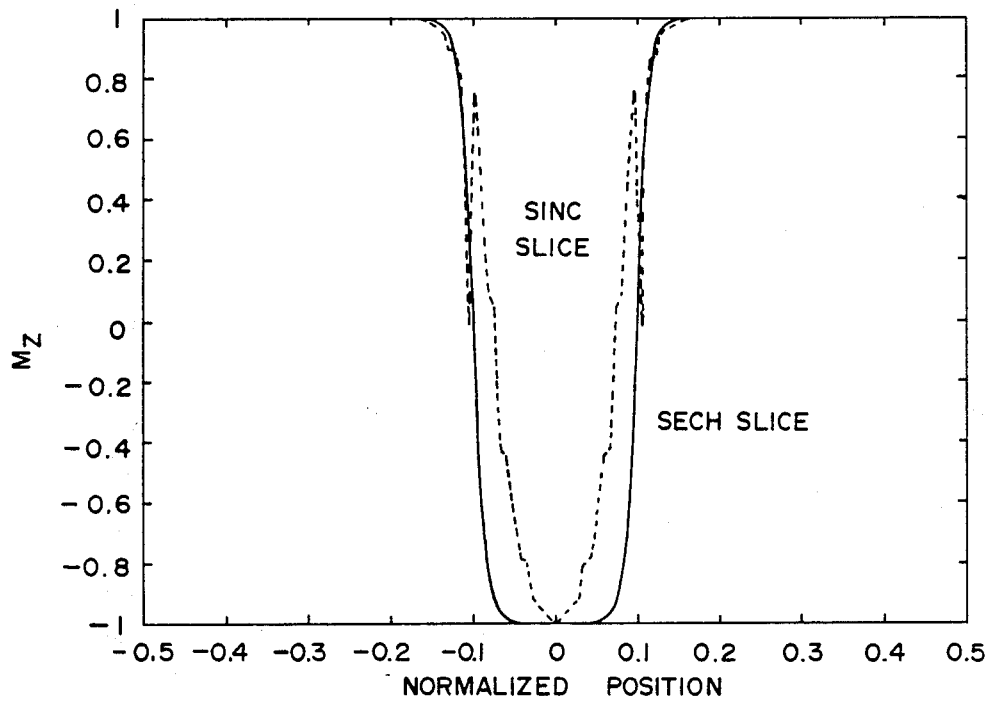
FIG.—10

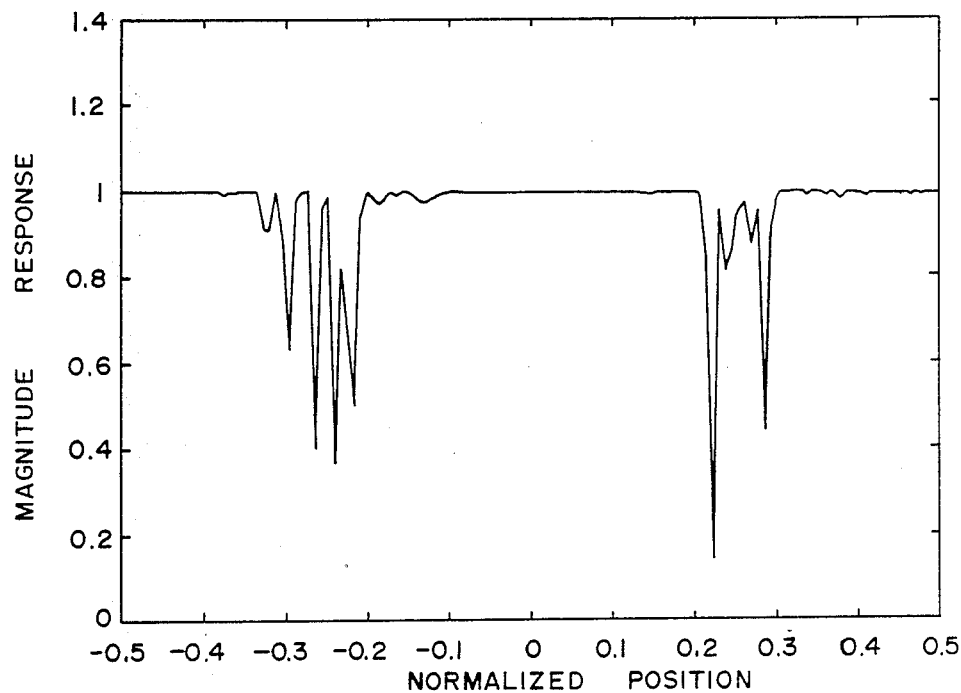
FIG.—11A
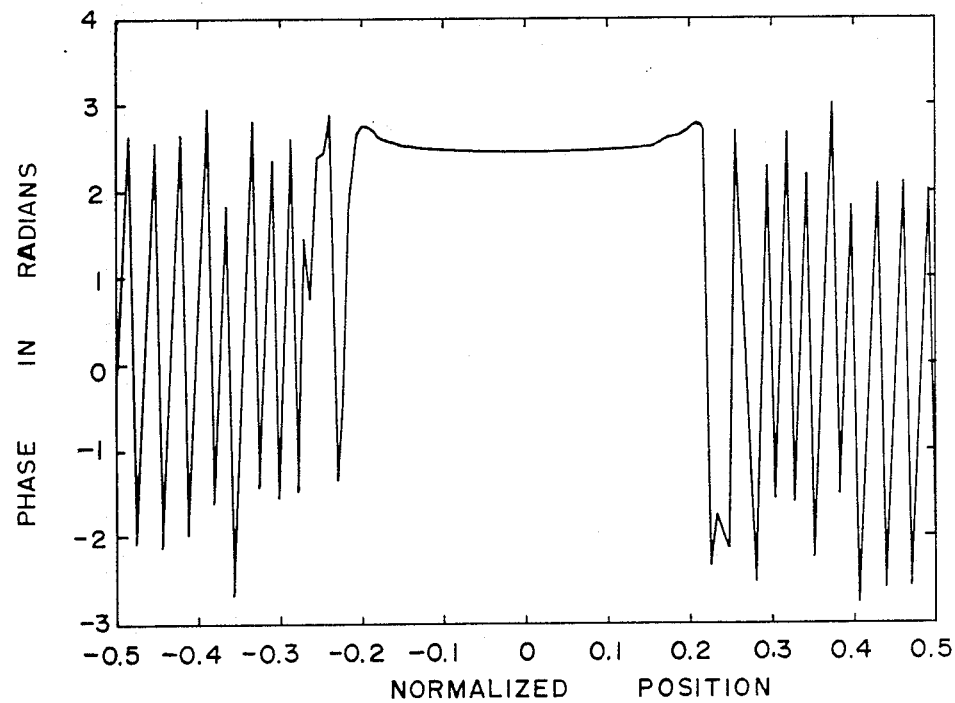
FIG.—11B

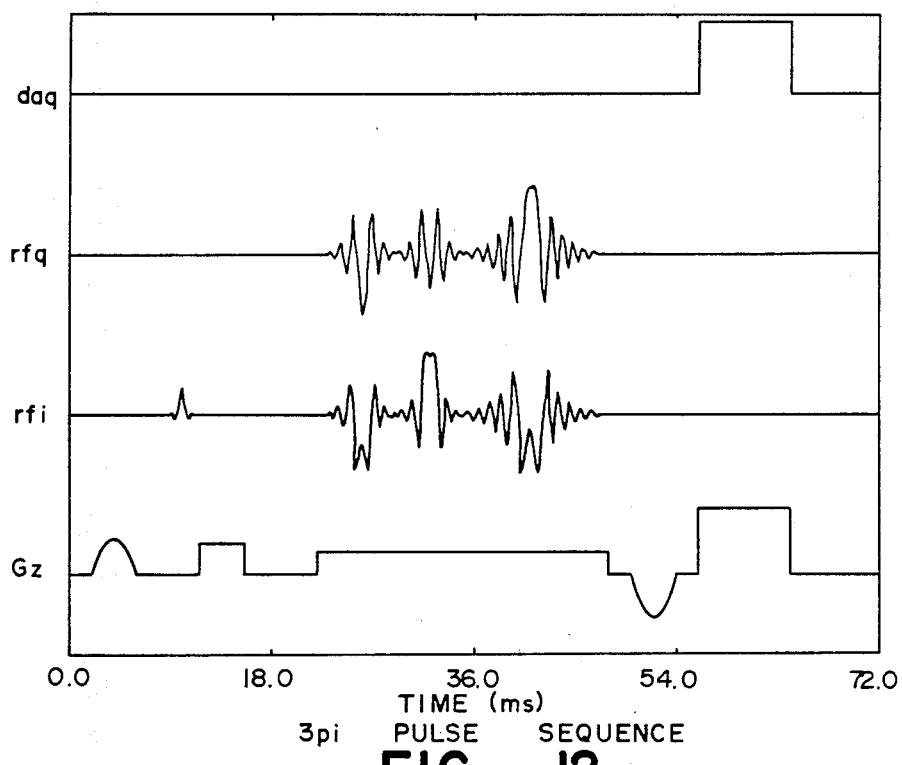
FIG.—12
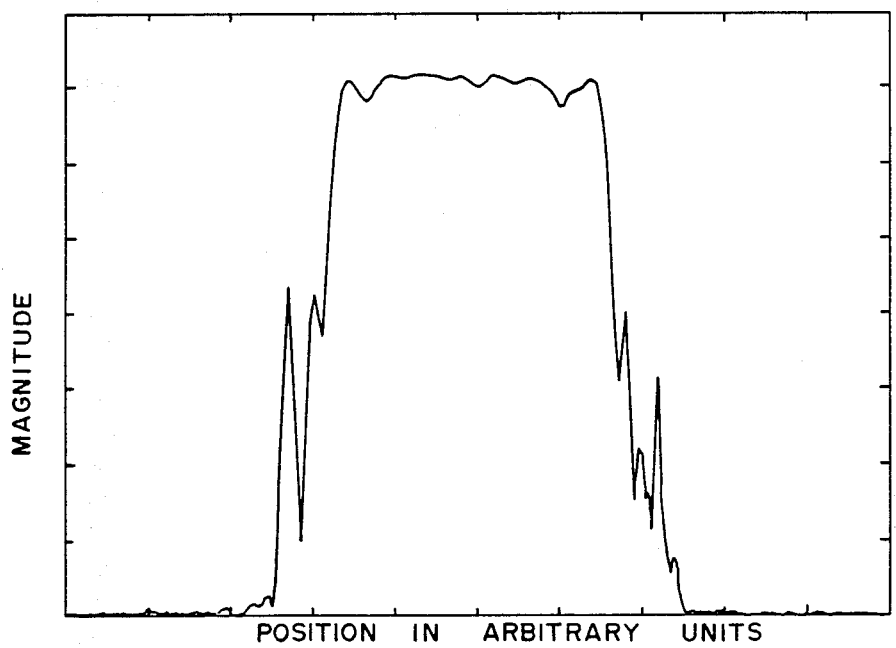
FIG.—13A

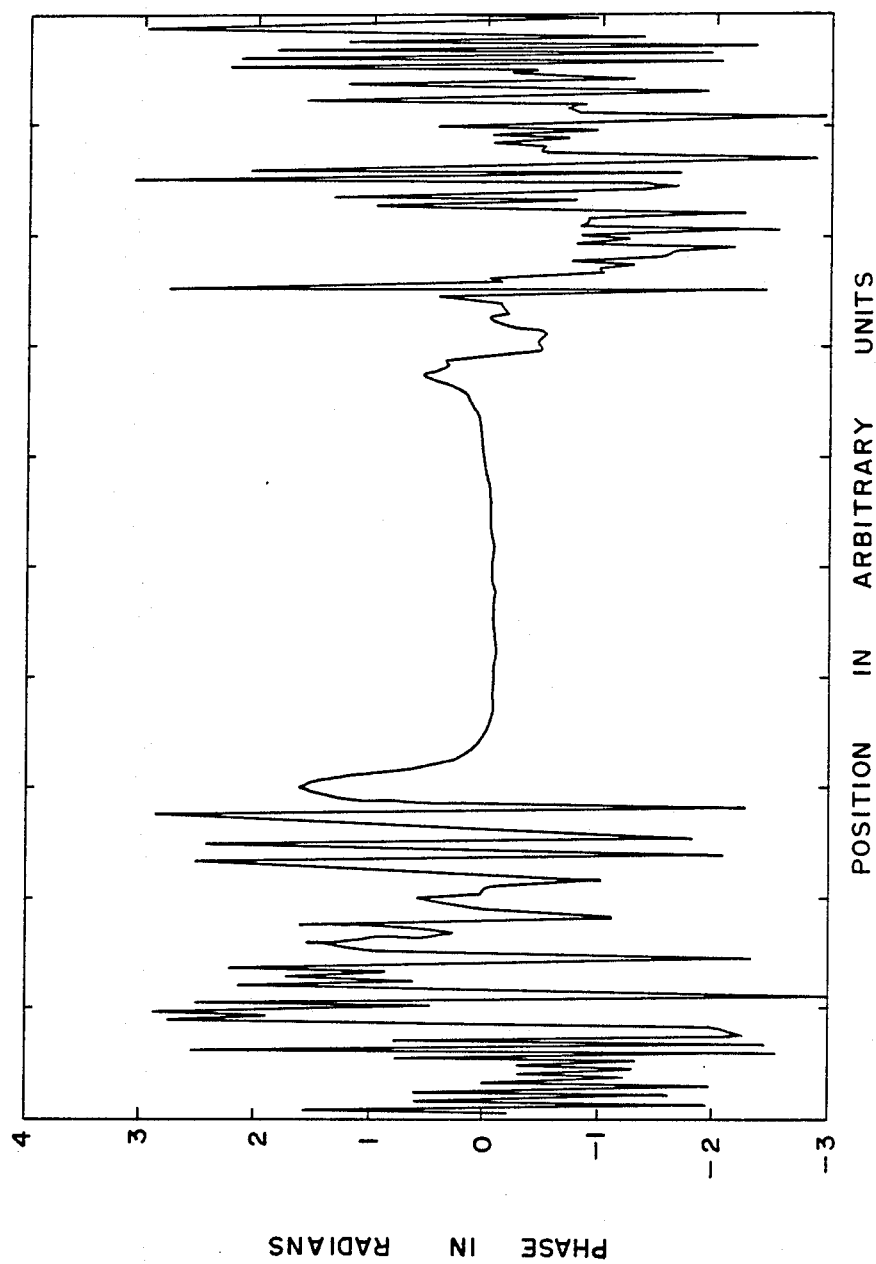
FIG.—13B

METHOD AND MEANS FOR MAGNETIC RESONANCE SPIN-ECHO IMAGING USING AN ADIABATIC THREE PI PULSE SEQUENCE

BACKGROUND OF THE INVENTION

The U.S. Government has rights in this invention pursuant to National Institute of Health grants HL-39478, HL-39297, HV-38045, and HL-34962.

This invention relates generally to magnetic resonance imaging, and more particularly the invention relates to spin-echo imaging using hyperbolic secant pulses.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils By manipulating the magnetic fields, an array of signals is provided representing different regions of the volume. These are combined to produce a volumetric image of the nuclear spin density of the body.

A descriptive series of papers on NMR appeared in the June 1980 issue of the *IEEE Transactions on Nuclear Science*, vol. NS-27, pp. 1220–1255. The basic concepts are described in the lead article, "Introduction to the Principles of NMR," by W. V. House, pp. 1220–1226, which employ computed tomography reconstruction concepts for reconstructing cross-sectional images A number of two-and three-dimensional imaging methods are described. Medical applications of NMR are discussed by Pykett in "NMR Imaging in Medicine," *Scientific American*, May 1982, pp. 78–88, and by Mansfield and Morris, *NMR Imaging in Biomedicine*, Academic Press, 1982.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return- to with the static field and give up the energy in the form of weak but detectable free induction decay (FID). These FID signals are used by a computer to produce images The excitation frequency, and the FID frequency, is defined by the Larmor relationship which states that the angular frequency $\omega_0$, of the precession of the nuclei is the product of the magnetic field $B_0$, and the so-called magnetogyric ratio, $\gamma$, a fundamental physical constant for each nuclear species:

$$\omega_0 = B_0 \cdot \gamma$$

Accordingly, by superimposing a linear gradient field, $B_z = z \cdot G_z$, on the static uniform field, $B_o$, which defines Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

Due to inhomogeneity of the static field and due to the gradient fields, nuclei spins in a selected slice can become dephased due to differences in precession. The spin echo technique has been introduced to overcome the dephasing of the spins. Briefly, after applying an initial 90-degree pulse to flip nuclei spins at a right angle to the static and gradient field, a 180-degree pulse is applied to turn the dephased spins over into a mirror-image position. The 180-degree pulse is applied after a time period, $\tau$, following the initial 90-degree pulse, and after a time period, $2\tau$, following the initial 90-degree pulse the spins are refocused and create a "spin echo" which can be sensed for imaging purposes.

Heretofore, adiabatic (180-degree) pulses have been used to invert spins in the presence of both RF and $B_o$ inhomogeneity. Hioe and Silver et al., *Physical Review* 1984, independently determined that the Bloch equation an analytic solution when driven by the complex hyperbolic secant pulse. Moreover, they discovered that the pulse inverts spins at any pulse amplitude exceeding a threshold. This insensitivity to RF variations makes adiabatic pulses appealing for both MR imaging and spectroscopy.

However, adiabatic inversion pulses have been unsuitable to selective spin echo generation because they leave a nonlinear phase variation across the slice. This phase cannot be refocused with linear gradients and causes signal loss when integrated in the projection through the slice. Kunz, *Magnetic Resonance in Medicine* (1987), showed that a "small-tip" $\pi/2$ pulse - essentially the adiabatic inversion pulse at exact amplitude to achieve a $\pi/2$ rotation could generate equal and opposite phase to compensate the $\pi$ pulse. A drawback of his technique is that both the $\pi/2$ rotation and its consequent phase compensation sensitive to RF variations.

Bendall et al., *Magnetic Resonance in Medicine* 1987 have recently proposed a selective refocusing pulse or spectroscopy and surface coil imaging applications. Their innovation was to reflect the second half of the excitation trajectory during an inversion pulse. For selective excitation using gradients, this reflection would require reversing the gradient amplitude during the pulse, and it would force the second half of the pulse to compensate for the phase accumulated during the first half of the pulse. Although this compensation is immune to RF amplitude variations, off-resonance spins are not completely refocused since one cannot switch the inhomogeneity field

SUMMARY OF THE INVENTION

An object of the present invention is an improved method and means for spin-echo imaging using adiabatic pulses.

A feature of the invention is the generation and use of a composite 360-degree ($2\pi$) and 180-degree ($\pi$) pulse for rephasing transverse spins for spin-echo sensing.

Briefly, an adiabatic pulse for selective spin echo generation is introduced This pulse has the advantage that the gradient is static during the pulse. Hence, off-resonance spins are indistinguishable from spins shifted in the gradient field direction. The pulse is actually a composite sequence of a phase-uncompensated $2\pi$ pulse followed by a $\pi$ pulse at half the sweep rate. The $2\pi$ pulse merely compensates for the $\pi$ pulse by inscribing equal and opposite phase across the slice; it performs no net rotation. The pulse may be useful for standard imaging sequences, for surface-coil excitation, and for spectroscopy The invention and objects and features thereof will be more fully understood from the following detailed description and appended claims when taken with the drawing

BRIEF DESCRIPTION OF THE DRAWINGS

FIGS. 1A-1D illustrate the arrangement of MRI apparatus and magnetic fields generated therein.

FIG. 2 is a functional block diagram of MRI imaging apparatus.

FIG. 3 illustrates a basic pulse sequence for exciting a slab for projection image.

FIG. 4 illustrates the $3\pi$ adiabatic pulse sequence in accordance with one of the invention.

FIG. 5. illustrates the inversion $\pi$ pulse in its amplitude/frequency sweep form.

FIG. 6 is a parametric plot of the locus of points touched by the tip of the $\pi$ inversion sweep vector.

FIG. 7 is a parametric plot of the locus of points touched by the tip of the uncompensated $2\pi$ pulse.

FIG. 8 illustrates the $3\pi$ pulse sequence in its amplitude/frequency sweep form.

FIG. 9 illustrates a comparison of the envelope of a sech $\pi$ pulse with $\mu = 4$ and a sinc pulse of the same bandwidth. FIG. 10 illustrates simulated inversion slice profiles derived from a sech pulse and a sinc pulse of the same bandwidth.

FIG. 11(a) illustrates a simulated spin-echo slice profile after a selective $3\pi$ pulse.

FIG. 11(b) illustrates a simulated spin-echo slice profile after a selective $3\pi$ pulse.

FIG. 12 illustrates the pulse sequence used for testing the spin-echo pulse.

FIG. 13A illustrates magnetic slice profile used to test spin-echo pulse, and FIG. 13B illustrates the phase profile in testing the spin-echo pulse.

DETAILED DESCRIPTION OF THE ILLUSTRATIVE EMBODIMENTS

Referring now to the drawings, FIG. 1A is a perspective view partially in section illustrating coil apparatus in NMR imaging system, and FIGS. 1B-1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE*, Vol. 71, No. 3, March 1983, pp. 338-350. Briefly, the uniform static field $B_o$ is generated by the magnet comprising the coil pair 10. A gradient field $G(x)$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in *NMR - A Perspective on Imaging*, General Electric Company, 1982. A computer 20 is programmed to control the of the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

FIG. 3 is a graph illustrating applied RF pulses for a 180° flip angle and a 90° flip angle followed by a "time reversal" 180° pulse and the associated Z axis magnetic field gradient applied during application of the RF pulses The illustrated pulses are conventional sinc pulses which have front and back lobes with a main RF pulse therebetween.

FIG. 4 shows the composite pulse in its modulated form. Although all examples herein are derived from the hyperbolic secand family, the phase compensation principle applies in general. Table 1 below gives the design equations for an adiabatic spin-echo pulse, $B_1(t)e_{i\phi(t)}$. The pulse has a total of 4n points. Its bandwidth is $\pm\mu\beta$ rads/sec. The parameter $\mu$ governs the quality of the slice profile. Silver, supra, showed that the ratio of transition-width to slice-width is about $2/\mu$. Hence, if $\mu \geq 3$, then slice profile is reasonably square. For the pulse described herein, $\mu = 5$ and $\beta = 8$.

TABLE 1

| Duration | | $B_1(t)$ | $\phi(t)$ |
| --- | --- | --- | --- |
| $2\pi$ | T/4 | $\mu\beta$ sech $(\mu t)$ | $-\mu$ ln sech $(\beta t)$ |
| | T/4 | $-\mu\beta$ sech$(\beta t)$ | $\mu$ ln sech $(\beta t)$ |
| $\pi$ | T/2 | $-\mu\beta$ sech $(\beta t/2)$ | $2\mu$ ln sech $(\beta t/2)$ |

Table 2 below gives a sampling schedule that precisely balances the phase accrued from each of the two pulses.

TABLE 2

| Pulse | Interval i | t [i] |
| --- | --- | --- |
| $2\pi$ | $0 \leq i < n$ | $t_0 + i/n$ |
| | $n \leq i < 2n$ | $t_0 + (i - n)/n$ |
| $\pi$ | $2n \leq i < 4n$ | $t_1 + (i - 2n)/n$ |

In the tables above, $t_o = -1/2 + 1/(2n)$ and $t_1 = -1 + 1/(2n)$. A constant phase term can be added to the $\phi(t[i])$ to rotate the entire slice. The successful construction of this pulse requires precise balancing of the $2\pi$ pulse and the $\pi$ pulse.

To explain how the pulse functions, the characteristic phase profile of an adiabatic inversion pulse must first be described.

Inversion Pulse Phase Profile: Suppose one applies a selective inversion pulse immediately following a nonselective $\pi/2$ pulse. After the first pulse, the magnetization vectors point in the y direction The inversion pulse is north pole to the south pole. This is most easily seen in a frame rotating with the RF excitation vector. Spins initially perpendicular to the adiabatic sweep vector remain perpendicular, and they precess about the effective field at the Larmor frequency, which is determined by the local field strength. As an example, consider the hyperbolic secant pulse. This pulse, at amplitude A, and in a gradient field $\gamma Gz$, is equivalent to excitation with $$\gamma B_{eff}(A,z,t) = \begin{bmatrix} \gamma A \text{sech}\beta t \\ 0 \\ \gamma Gz - \mu\beta\tanh\beta t \end{bmatrix} \quad [1]$$

The RF and frequency sweep, sech$\beta t$ and $-\mu$-62 tanh$\beta t$, are plotted in FIG. 5. A parametric plot (x, z) best reveals the inversion sweep. The effective excitation vector at z =0 traces the trajectory drawn parametrically in FIG. 6. Note that is offset positions, the excitation vector traces a vertically-offset ellipse. Because the perpendicular spins precess about the $B_{eff}$ field at the Larmor frequency, their final phase is given by $$|\theta(A,z)| = \gamma \int^T_{-T} \| B_{eff}(A,z,\tau) \| d\tau \quad [2]$$

Hence, although in-slice perpendicular spins remain perpendicular with immunity to RF inhomogeneity, the phase of these spins will be sensitive to amplitude variations of the excitation vector. Any robust phase-compensation scheme must take this phase sensitivity into account.

Uncompensated $2\pi$ pulse: A selective $2\pi$ pulse can be constructed by cascading two hyperbolic secant pulses with opposite sweep directions. This produces the effective sweep trajectory depicted in FIG. 7.

Spins initially pointing in the z direction inside the sweep circle are completely inverted and ultimately returned to their original orientation Transverse spins within the circle are ultimately returned to the transverse plane after accumulating exactly twice the phase of the inversion pulse.

Out-of-slice spins initially pointing in the z direction are ultimately returned to the z axis, while transverse spins are returned with phase accumulation If the two pulses have the same sweep direction, then phase will not accumulate in-slice. Hence, the opposing $\pi$ pair is herein referred to as "uncompensated", and the nonopposing pair "compensated". The uncompensated $2\pi$ pulses is needed to cancel the phase from the subsequent $\pi$ pulse.

Phase Compensation: $3\pi$ Pulse: To compensate the phase from the $2\pi$ pulse, the accumulated from the $\pi$ pulse must be doubled. Furthermore, this doubling must be robust to variations of the RF amplitude. A simple, robust scheme for phase doubling is to apply the entire $\pi$ pulse for the same duration as the $2\pi$ pulse. Essentially, each time point during the $\pi$ pulse is compensated exactly by the sum of two "image" points from the $2\pi$ one from each of the composite $\pi$'s.

The $2\pi$ pulse and the half-rate $\pi$ pulse have the same bandwidth and the same maximum RF magnitude. The two pulses are shown in their RF/frequency sweep form in FIG. 8. The instantaneous frequency is $\Omega(t) = d\phi/dt$, and $B_1(t)$ is the magnitude of the original pulse. Note that the discontinuity in the frequency sweep between the two pulses allows for "locking" the spins from the opposite side, causing phase from the second pulse to accumulate in the opposite direction. This effect is similar to that caused by a $B_{eff}$ flip. Without this discontinuity, the $2\pi$ pulse would double rather than cancel the net phase.

Out-of-slice spins initially pointing along z are ultimately returned to z. Out-of-slice spins initially lying in the transverse plane are not echoed; indeed they experience a strong phase variation as a function of the gradient direction.

SAR Considerations: In medical imaging applications, Specific Absorption Rate (SAR) is a critical specification for any RF pulse. Here the SAR from a standard sinc $\pi$ pulse may be compared with the SAR from adiabatic $\pi$ and $3\pi$ pulses of the same bandwidth.

Since pulse: Using the definition for the sinc pulse, sinc(t) = sin$\pi t/\pi t$, and Caprihan's normalized units for RF amplitude and duration (5), one finds that $$\gamma B_1(t) = \pi F_0 \text{sinc}(F_0 t), \quad [3]$$

performs a selective $\pi$ rotation over the region f $= \pm F_0/2$. Ignoring windowing effects, the area under the pulse is $\pi$. The SAR due to this pulse, when applied at repetition time TR, is $$SAR_{sinc} = \frac{\pi^2 F_0}{TR} \int_{-T}^{T} F_0 \text{sinc}^2(F_0\tau) d\tau \quad [4]$$

$$\approx \frac{\pi^2 F_0}{TR} \quad [5]$$

Sech $\pi$ Pulse: In order to achieve adiabatic excitation, the amplitude of a sech $\pi$ pulse must be greater than $\mu\beta$. $\mu\beta = \pi F_o$ is set to equate the bandwidth of the two pulses. Hence, the sech pulse $$\gamma B_1(t) = \pi F_0 \text{sech}\left(\frac{\pi F_0 t}{\mu}\right)^{1+i\mu}, \quad [6]$$

performs an inversion of comparable bandwidth. Note that the peak magnitude is the same for the two pulses. This means that the pulses have the same *peak* power. The SAR of the sech pulse is $$SAR_{sech} = \frac{(\pi F_0)^2}{TR} \int_{-T}^{T} \text{sech}^2\left(\frac{\pi F_0 \tau}{\mu}\right) d\tau \quad [7]$$

$$\approx \frac{2\pi\mu F_0}{TR}. \quad [8]$$

Combining equations [8] and [5] one finds that the ratio of the SAR for a sech pulse to that of the an equal bandwidth sinc pulse is $$\frac{SAR_{sech}}{SAR_{sinc}} = \frac{2\mu}{\pi} \quad [9]$$

Slice Comparison: FIG. 9 shows the sech pulse on the same scale a an equal bandwidth sinc pulse. FIG. 10 shows the simulated inversion slice profiles. Note how much steeper is the slice profile of the hyperbolic secant. This sharp slice profile would enable contiguous slice acquisition. When not acquiring contiguous slices, one would have to use a $\pi$ since pulse with bandwidth twice that of the $\pi/2$ pulse to prevent the $\pi$ slice profile from degrading the net slice profile. Hence, the ratio $2\mu/\pi$ determined above is not based on a fair comparison. Including the factor of two required to double the bandwidth of the sinc pulse, one will obtain an effective SAR ratio of $$\frac{SAR_{sech}}{SAR_{sinc}} = \frac{\mu}{\pi}. \quad [10]$$

Because $\infty \geq \pi$ to ensure a reasonably square slice profile, this ratio exceeds 1. Sech $3\pi$ Pulse: The $3\pi$ pulse is a sequence with two $\pi$ pulses, each contributing to the effective SAR ratio $\mu/\pi$ followed by a half-rate $\pi$ pulse that contributes $2\mu/\pi$. Hence, the total SAR ratio is $4/\mu/\pi$. One may conclude that the $3\pi$ pulse has at least four times the SAR of an equivalent bandwidth sinc pulse.

Results: FIG. 11 shows the simulated response to the spin-echo pulse. The initial condition was along the x axis, and the simulation was computed using the piecewise constant solution to the Block equation (6). Note that out-of-slice spins are dephased, and the rotation is about the y axis. This simulation then models a sequence employing a non-selective $\pi/2$ pulse.

FIG. 12 shows the pulse sequence used to test the spin-echo pulse. Read-out was in the direction of slice-select. The $\pi/2$ pulse was nonselective. The experimental duration for the adiabatic $3\pi$ pulse 20was msec. Above a threshold amplitude, the response remained fixed. The magnitude slice profile is shown in FIG. 13(a), and the phase profile is shown in FIG. 13(b). Note that the small residual phase across the slice is linear, indicating that the echo time was slightly displaced from the center of the data acquisition window.

Conclusion: It has been demonstrated that an adiabatic 2-90 pulse can compensate for the phase of a half-rate selective $\pi$ pulse. Although the $3\pi$ pulse has relatively high SAR, it has much to recommend it:
- Because the pulse is immune to RF inhomogeneity and nonlinearity, image artifacts due to imperfect rotations would be almost eliminated.
- The pulse has an excellent slice profile that would enable contiguous slice acquisition.
- Unlike the adiabatic pulse designed in (4), this pulse requires no switching of the gradient field during the pulse. Hence, off-resonance spins would be echoed properly.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

We claim:

1. In spin-echo magnetic resonance imaging and spectroscopy, a method of refocusing dephased nuclei spins in an inhomogeneous RF magnetic field comprising the steps of applying a first selective adiabatic pulse for rotating nuclei spins 360 degrees ($2\pi$), and applying a second selective adiabatic pulse for rotating nuclei spins 180 degrees ($\pi$) for creating a spin echo, said first pulse producing no net nuclei rotation and compensating for phase variations of said second pulse.

2. The method as defined by claim 1 wherein said first pulse precedes said second pulse.

3. The method as defined by claim 1 wherein said second pulse precedes said first pulse 4. The method as defined by claim 1 wherein the duration of said second pulse is equal to the duration of said first pulse.

5. The method as defined by claim 4 wherein said first and second pulses are hyperbolic secants, $B_1(t)^{i\phi(t)}$ and defined by the following table:

| Duration | $B_1(t)$ | $\phi(t)$ |
|---|---|---|
| $2\pi$ | T/4 | $\mu\beta$ sech $(\beta t)$ | $-\mu$ ln sech $(\beta t)$ |
| | T/4 | $-\mu\beta$ sech $(\beta t)$ | $\mu$ ln sech $(\beta t)$ |
| $\pi$ | T/2 | $-\mu\beta$ sech$(\beta t/2)$ | $2\mu$ ln sech $(\beta t/2)$ |

6. The method as defined by claim 5 wherein the sampling schedule of said first and second pulses is given by the following table:

| Pulse | Interval i | t [i] |
|---|---|---|
| $2\pi$ | $0 \leq i < n$ | $t_0 + i/n$ |
| | $n \leq i < 2n$ | $t_0 + (i-n)/n$ |
| $\pi$ | $2n \leq i < 4n$ | $t_1 + (i-2n)/n$ | where $t_o = -1/2 + 1/(2n)$ and $t_1 = -1 + 1/(2n)$.

7. A method of spin-echo imaging using magnet resonance techniques comprising the steps of
   (a) positioning an object to be imaged in a static magnet field with a gradient magnet field superimposed thereon, the composite field being inhomogeneous,
   (b) applying a 90-degree RF pulse to said object at the Larmor frequency for a selected slice to be imaged,
   (c) thereafter applying a $3\pi$ adiabatic pulse to refocus dephased nuclei spins in said selected slice, said $3\pi$ adiabatic pulse including a $2\pi$ pulse and a $\pi$ pulse where said $2\pi$ pulse produces no net nuclei rotation and compensates for phase variations introduced by said $\pi$ pulse, and
   (d) detecting a spin echo of the refocused nuclei spins in said selected slice.

8. The method as defined by claim 7 where the duration of said $\pi$ pulse is equal to the duration of said $2\pi$ pulse.

9. The method as defined by claim 8 wherein said first and second pulses are hyperbolic secants, $B_1(t)i\phi(t)$ and defined by the following table:

| Duration | $B_1(t)$ | $\phi(t)$ |
|---|---|---|
| $2\pi$ | T/4 | $\mu\beta$ sech $(\beta t)$ | $-\mu$ ln sech$(\beta t)$ |
| | T/4 | $-\mu\beta$ sech $(\beta t)$ | $\mu$ ln sech $(\beta t)$ |
| $\pi$ | T/2 | $-\mu\beta$ sech $(\beta t/2)$ | $2\mu$ ln sech $(\beta t/2)$ |

10. The method as defined by claim 9 wherein the sampling schedule of said first and second pulses is given by the following table:

| Pulse | Interval i | t [i] |
|---|---|---|
| $2\pi$ | $0 \leq i < n$ | $t_0 + i/n$ |
| | $n \leq i < 2n$ | $t_0 + (i-n)/n$ |
| $\pi$ | $2n \leq i < 4n$ | $t_1 + (i-2n)/n$ | where $t_o = -1/2 + 1 (2n)$ and $t_1 = -1 + 1(2N)$.

11. Apparatus for magnetic resonant imaging a slice through an object using spin-echo techniques, comprising
   (a) means for establishing a static magnetic field said object,
   (b) means for superimposing a gradient magnetic field said static magnetic field,
   (c) means for applying a 90-degree RF pulse to said object at the Larmor frequency for a selected slice to be imaged, (d) means for applying a $3\pi$ adiabatic pulse to refocus dephased nuclei spins in selected slice, said $3\pi$ adiabatic pulse including a $2\pi$ pulse and a $\pi$ pulse where said $2\pi$ pulse produces no net nuclei rotation and compensates for phase variations introduced by said $\pi$ pulse, and (d) means for detecting a spin echo of the refocused spins in said selected slice.

12. Apparatus as defined by claim 11 wherein the duration of said $\pi$ pulse is equal to the duration of said $2\pi$ pulse.

13. Apparatus as defined by claim 12 wherein said first and second pulses are hyperbolic secants, $B_1(t)$ i$\phi(t)$ and defined by the following table:

| | Duration | $B_1(t)$ | $\phi(t)$ |
|---|---|---|---|
| $2\pi$ | T/4 | $\mu\beta$ sech $(\beta t)$ | $-\mu$ ln sech $(\beta t)$ |
| | T/4 | $-\mu\beta$ sech $(\beta t)$ | $\mu$ ln sech $(\beta t)$ |
| $\pi$ | T/2 | $-\mu\beta$ sech $(\beta t/2)$ | $2\mu$ ln sech $(\beta t/2)$ |

14. Apparatus as defined by claim 10 wherein the sampling schedule of said first and second pulses is given by the following table:

| Pulse | Interval i | t [i] |
|---|---|---|
| $2\pi$ | $0 \leq i < n$ | $t_0 + i/n$ |
| | $n \leq i < 2n$ | $t_0 + (i - n)/n$ |
| $\pi$ | $2n \leq i < 4n$ | $t_1 + (i - 2n)/n$ | where $t_0 = -1/2 + 1/(2n)$ and $t_1 = -1 + 1/(2n)$.

* * * * *